United States Patent [19]

Maemura

[11] Patent Number: 5,172,400
[45] Date of Patent: Dec. 15, 1992

[54] FREQUENCY DIVIDER EMPLOYING MULTIPLE STAGES OF MASTER/SLAVE FLIP-FLOPS

[75] Inventor: Kousei Maemura, Itami, Japan

[73] Assignee: Mitsubishi Denki Kabushiki Kaisha, Tokyo, Japan

[21] Appl. No.: 680,240

[22] Filed: Apr. 3, 1991

[30] Foreign Application Priority Data

Aug. 24, 1990 [JP] Japan .................. 2-223406

[51] Int. Cl.$^5$ .............................. H03K 21/06
[52] U.S. Cl. ...................... 377/116; 377/114; 377/115; 377/47; 377/48
[58] Field of Search ............ 377/116, 114, 47, 48, 377/56, 115

[56] References Cited

U.S. PATENT DOCUMENTS

| | | | |
|---|---|---|---|
| 3,943,379 | 3/1976 | McGuffin | 377/115 |
| 4,601,049 | 7/1986 | Wilhelm et al. | 377/115 |
| 4,606,059 | 8/1986 | Oida | 377/47 |
| 4,730,349 | 3/1988 | Wilhelm et al. | 377/116 |
| 4,799,040 | 1/1989 | Yanagi | 377/116 |
| 4,815,114 | 3/1989 | Pham | 377/116 |
| 4,926,451 | 5/1990 | Yoshihara et al. | 377/118 |

FOREIGN PATENT DOCUMENTS

| | | |
|---|---|---|
| 0017268 | 10/1980 | European Pat. Off. . |
| 60-216629 | 10/1985 | Japan . |
| 60-227520 | 11/1985 | Japan . |
| 61-57632 | 4/1986 | Japan . |
| 61-230427 | 10/1986 | Japan . |

*Primary Examiner*—John S. Heyman
*Assistant Examiner*—Scott A. Ouellette
*Attorney, Agent, or Firm*—Leydig, Voit & Mayer

[57] ABSTRACT

A frequency divider includes at least three master-slave flip-flops which are connected to each other in stages, each stage including a master flip-flop and a slave flip-flop, to construct a 1/N frequency divider. At least two outputs whose periods are the same but phases are different are taken out from a master flip-flop and a slave flip-flop and combined to obtain a 1/(N/2) divided output signal. As a result, a divided output signal whose period does not vary with time is obtained and, when the N is an even number, an output signal with a duty ratio of ½ is obtained. A pulse signal former includes a differential amplifier to which two signals whose periods and pulse widths are the same but phases are shifted by a pulse width and an output obtained by comparing those two signals is output from the pulse signal former. As a result, an output signal whose duty ratio is ½ is obtained.

7 Claims, 15 Drawing Sheets

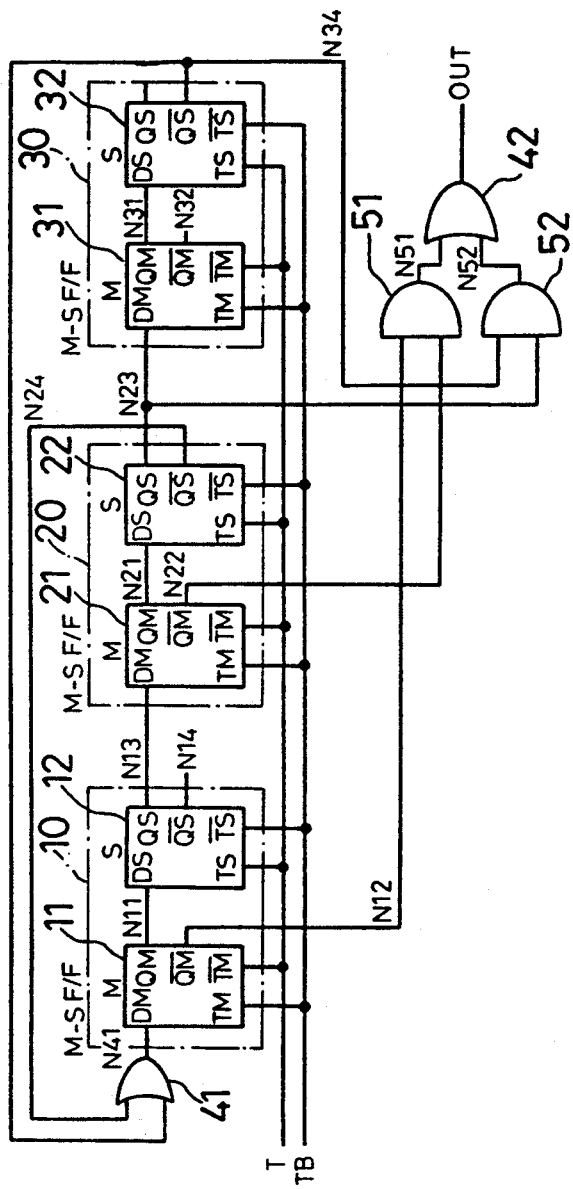
F I G. 1

FREQUENCY DIVIDER EMPLOYING MULTIPLE STAGES OF MASTER/SLAVE FLIP-FLOPS

FIELD OF THE INVENTION

The present invention relates to a frequency divider and a pulse signal former and, more particularly, to a frequency divider having a new division and a pulse signal former for of implementing a frequency divider having a new division with high performance.

BACKGROUND OF THE INVENTION

FIG. 13 is a view showing a conventional 1/(N/2) frequency divider, that is, a 1/2.5 divider when N is 5. In FIG. 13, reference numerals 10, 20 and SO each designate a master-slave type flip-flop (referred to as an M-S F/F hereinafter) and reference numerals 41 and 42 each designate an OR circuit. Reference T designates a dividing signal input terminal and reference OUT designates a dividing signal output terminal. In addition, references D, Q, $\bar{Q}$, and T shown in M-S F/F designate a data input terminal, an output signal terminal, an inverted signal output terminal and a clock signal input terminal of the M-S F/F, respectively. Reference numerals N11 to N42 each designate the potential of a corresponding signal line, in which the N11 and the N12 are an output signal and an inverted output signal of the M-S F/F 10, respectively, the N22 is an inverted output signal of the M-S F/F 20, the N31 and the N32 are an output signal and an inverted output signal of the M-S F/F 30, and the N41 and the N42 are output signals of the OR circuits 41 and 42, respectively.

Next, operation thereof will be described hereinafter.

Each M-S F/F constitutes a delay type flip-flop, in which a signal input to the data signal input terminal D is output in synchronization with a clock signal. In the M-S F/F's 10 and 20, when the signal N31 input to the OR circuit 42 is "High", ½ dividing operation is performed and the input signal to the dividing signal input terminal T is divided into ½, so that a ½ dividing output can be obtained from the N11. When the signal N31 is "Low", the M-S F/F's 10 and 20 perform ⅓ dividing operation and its output signal OUT is obtained from the N11. In addition, the M-S F/F 30 performs ½ dividing operation and its output is obtained at the N31.

Next, operation of this frequency divider will be described hereinafter in reference to FIG. 14. FIG. 14 shows signal waveforms of the signal lines of the frequency divider. In FIG. 14, each reference designates a waveform of a signal of a terminal or a potential shown in FIG. 13. One "High" interval of the N31, signal corresponds to one period of the N11 and to two periods of the T. Since the signal of the N31 is inverted for one period of the N11, the N31 becomes "Low". One "Low" interval of the N31 corresponds to three periods of the T. Then, the N31 becomes "High" after three periods of the T signal. Thus, the above operation is repeated. Since the output of the frequency divider is the N11, the frequency divider repeats ½ dividing operation and ⅓ dividing operation and then the output signal OUT having one period in five periods of the dividing input signal T can be obtained. Thus, 2/5, that is, 1/2.5 frequency divider can be obtained.

Next, a ⅓ frequency divider when the N is 6 will be described hereinafter as a conventional example of the 1/(N/2) frequency divider.

In FIG. 15, the same references as in FIG. 13 designate the same elements or elements having the same functions. The ⅓ frequency divider is different from the 1/2.5 divider shown in FIG. 13 in that one M-S F/F and one OR circuit are omitted.

Next, operation thereof will be described hereinafter.

The ⅓ frequency divider performs the same operation as that when the N31 of the frequency divider shown in FIG. 15 is always "Low". In addition, operation of the frequency divider will be described in reference to FIG. 16. FIG. 16 shows signal waveforms on corresponding signal lines of the frequency divider. In FIG. 16, each reference designates a waveform of a signal at a terminal or a potential shown in FIG. 15. One period of the output signal OUT (N11) corresponds to three periods of the T. The OUT signal is "High" for two periods of the T. Thus, a frequency divider capable of obtaining 1/(6/2), that is, ⅓ dividing output can be provided.

FIG. 17 is a view showing a conventional pulse signal former for obtaining a pulse signal whose duty ratio, that is, ratio of a pulse width to a period of pulse, is ½.

In FIG. 17, reference numeral 200 designates a band-pass filter and reference numeral 201 designates a pulse waveformer. Reference numeral IN1 designates an input signal, reference numeral N200 designates an output signal of a band-pass filter and reference OUT designates an output signal of the circuit.

Next, operation of this pulse signal former will be described hereinafter.

Since a sine wave whose period is a period of a pulse signal is only taken out from the input pulse signal IN1 by the band-pass filter 200, the difference in duty ratio between the pulse signals is disregarded. Then, since the sine wave is converted to a pulse signal by the pulse waveformer 201, the output signal OUT becomes a pulse signal whose duty ratio is ½.

Since the conventional frequency divider is formed as described above, when the N is an odd number (for example, N=5) in the 1/(N/2) frequency divider, only a signal whose period varies with time is obtained as the output signal OUT as shown in FIG. 14. In addition, the duty ratio of the output signal is not ½, which is a problem.

In addition, when the N is not a multiple of 4 (for example, N=6), the duty ratio of the output signal is also not ½.

Those facts cause distortion of a signal when an operation such as modulation, demodulation or orthogonal modulation is performed.

In addition, according to the conventional pulse signal former, since the band-pass filter 200 is used as shown in FIG. 17, the usable frequency is limited to the range of the operation frequency of the band-pass filter.

SUMMARY OF THE INVENTION

The present invention was made to solve the above problems and it is an object of the present invention to provide a frequency divider in which a 1/(N/2) dividing output signal having a constant period is obtained.

It is another object of the present invention to provide a frequency divider in which an output signal whose period is constant and duty ratio is ½ can be obtained from two 1/(N/2) output signals whose periods are constant.

It is a further object of the present invention to provide a pulse signal former in which an output signal whose duty ratio is ½ can be obtained over a large range of frequency.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a frequency divider of the present invention, a 1/N frequency divider includes a master-slave type flip-flop (M-S F/F) and two or more output signals whose periods are the same but phases are different from each other are produced at a master stage and a slave stage of the 1/N frequency divider. Then, those output signals are combined to obtain a 1/(N/2) dividing signal. As a result, a 2/N dividing signal, that is, a 1/(N/2) dividing signal whose period is always constant can be obtained.

In addition, according to the present invention, two 1/(N/2) dividing signals whose periods and pulse widths are the same but phases are different by a pulse width are produced at the frequency divider and those two signals are input to a differential amplifier, and a signal obtained by comparing the two signals is output as an output signal. As a result, a dividing signal output whose pulse width is ½ of its period is obtained.

In addition, according to a pulse signal former of the present invention, there is provided a differential amplifier to which two signals whose periods and pulse widths are the same but phases are different by a pulse width are input, and an output obtained by comparing those two signals is output from the pulse signal former. As a result, an output signal whose pulse width is ½ of its period is obtained.

BRIEF DESCRIPTION OF THE DRAWINGS

FIG. 1 is a view showing a structure of a frequency divider in accordance with a first embodiment of the present invention;

DETAILED DESCRIPTION OF PREFERRED EMBODIMENTS

Figure 2:
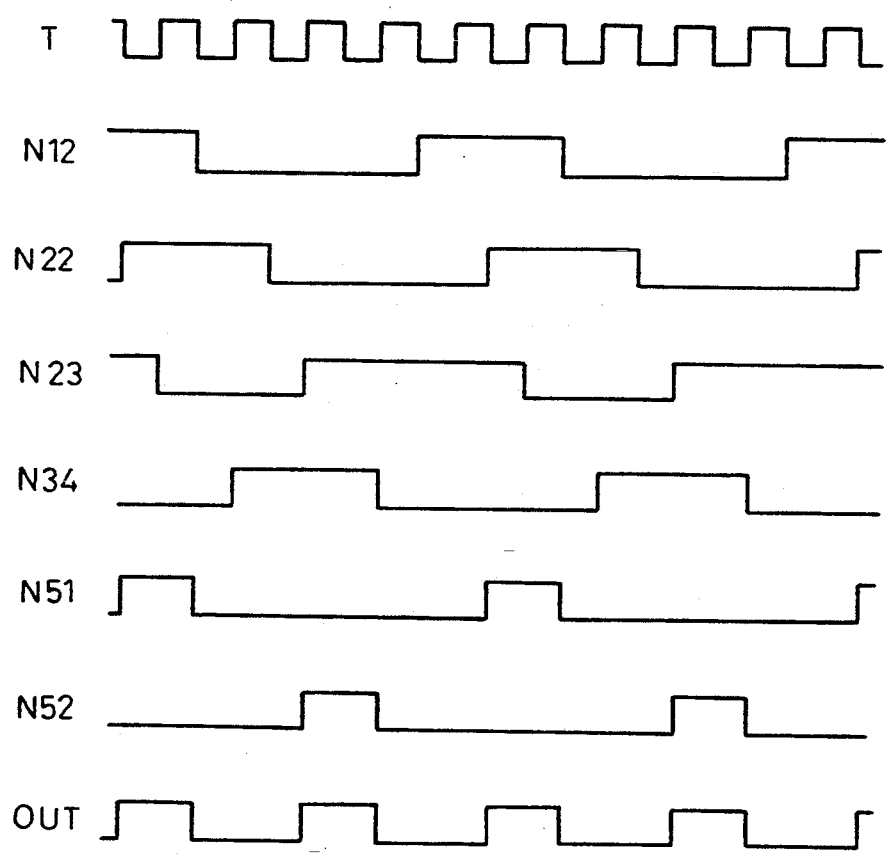
FIG. 2 is a view showing signal waveforms for describing operation of the frequency divider shown in FIG. 1.

Embodiments of the present invention will be described in detail hereinafter in reference to the drawings.

FIG. 1 is a view showing a 1/(5/2), that is, 1/2.5 frequency divider invention.

In FIG. 1, reference numerals 10, 20 and 30 each designate a master-slave type flip-flop (referred to as an M-S F/F hereinafter), reference numerals 11, 21 and 31 each designate a master stage of the M-S F/F, reference numerals 12, 22 and 32 each designate a slave stage of the M-S F/F. Reference numerals 51 and 52 each designate an AND circuit and reference numerals 41 and 42 each designate an OR circuit. References T and TB designate a dividing signal input terminal and an input terminal of an inverted signal of the dividing signal, respectively. Reference OUT designates a dividing signal output terminal. In addition, references DM, QM, $\overline{QM}$, TM, $\overline{TM}$ designate a data input terminal, an output terminal, an inverted signal output terminal, a clock signal input terminal and an inverted signal input terminal of a clock signal of the master stage of the M-S F/F, respectively. In addition, references DS, QS, $\overline{QS}$, TS and $\overline{TS}$ designate a data input terminal, an output signal terminal, an inverted signal output terminal, a clock signal input terminal, and an inverted signal input terminal of a clock signal of the slave stage of the M-S F/F, respectively. Reference numerals N11 to N52 each designate a potential of a corresponding signal line, in which N11 and N12, N13 and N14, N21 and N22, N23 and N24, N31 and N32, and N33 and N34 designate output signals and inverted output signal of the flip-flops 11, 12, 21, 22, 31 and 32, respectively and N41 is an output signal of the OR circuit 41 and N51 and N52 ar output signals of the AND circuits 51 and 52, respectively, Next, operation thereof will be described hereinafter.

Referring to FIG. 1, the M-S F/F's 10, 20 and 30 form a frequency divider having dividing ratio of 1/5 whose output can be taken out from any of the signal lines N11 to N34. The AND circuits 51 and 52 and the OR circuit 42 combine the above outputs and then a 1/2.5 dividing output is obtained.

The operation of the frequency divider will be further described hereinafter in reference to FIG. 2.

FIG. 2 shows signal waveforms of signal lines of the frequency divider. In FIG. 2, each reference numeral designates a waveform of a signal on a corresponding signal line shown in FIG. 1. The N51 is an output of AND operation of the N12 and the N22 and its period corresponds to 5 periods of the dividing input signal T and while it is "High" for one period of the T. In addition, the N52 is an output of AND operation of the N23 and N34. One period of the N51 signal corresponds to 5 periods of the dividing input signal T and N51 is "High", a signal of one period of the T. The N51 differs from the N52 by 2.5 periods of the dividing input signal T and these signals are combined so that the output signal OUT is provided. The period of the thus provided output signal OUT corresponds to 2.5 periods of the dividing input signal T and one "High" interval of the OUT signal corresponds to one period of the T. More specifically, 1/2.5 frequency divider can be implemented.

Next, another 1/2.5 frequency divider in accordance with a second embodiment of the present invention will be described hereinafter in reference to FIG. 3.

Figure 3:
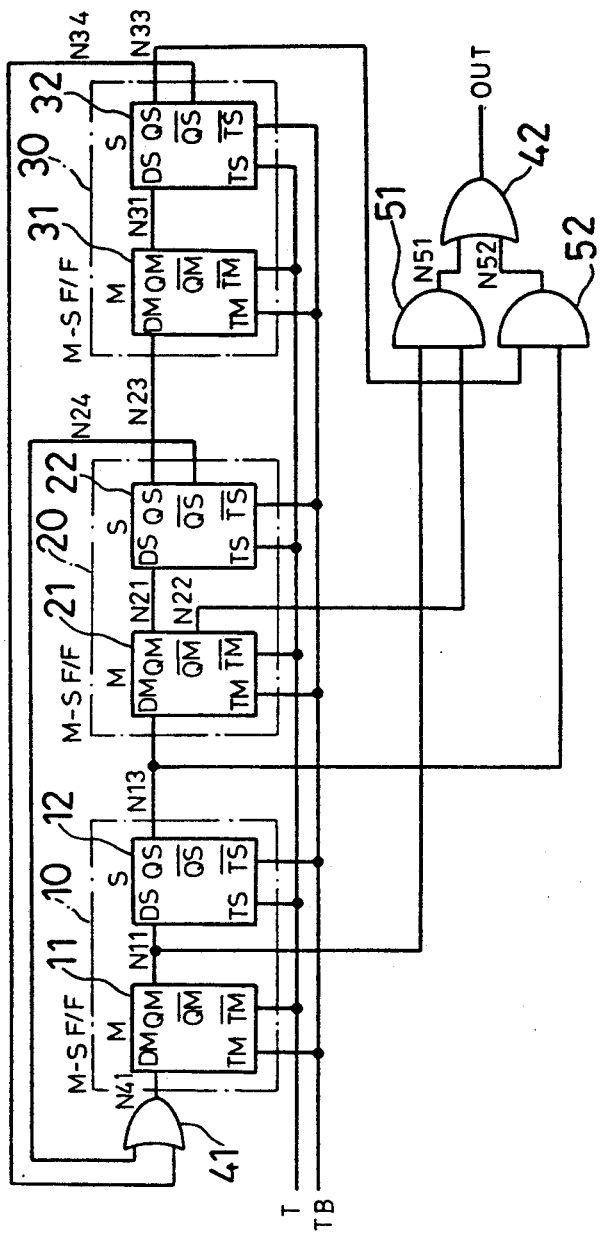
FIG. 3 is a view showing a structure of a frequency divider in accordance with a second embodiment of the present invention.

In FIG. 3, the same references as in FIG. 1 designate the same or corresponding parts. The 1/2.5 frequency divider shown in FIG. 3 is different from that shown in FIG. 1 in that the outputs to the AND circuits 51 and 52 are the N11, N13, N22 and N33 signals.

Next, operation thereof will be described hereinafter in reference to FIG. 4.

Figure 4:
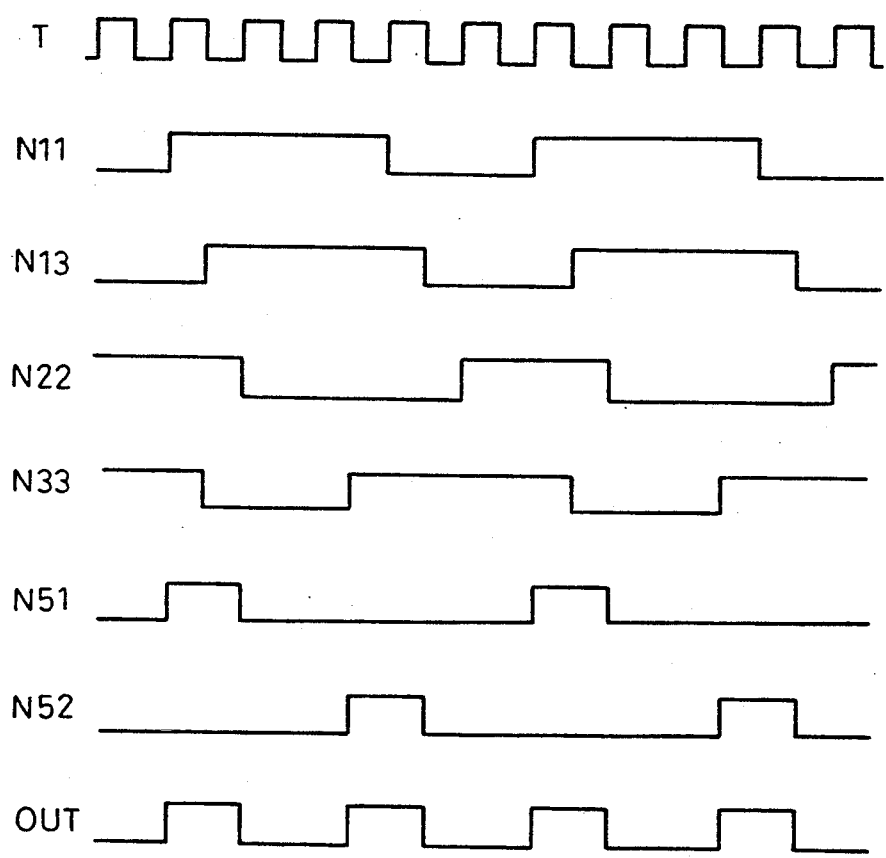
FIG. 4 is a view showing signal waveforms for describing operation of the frequency divider shown in FIG. 3.

FIG. 4 shows signal waveforms of signal lines of the frequency divider. In FIG. 4, each reference designates a waveform of a signal on a corresponding signal line shown in FIG. 3. As can be seen from the figure, one period of the output signal OUT corresponds to 2.5 periods of the dividing signal T.

In these frequency dividers in accordance with the first and second embodiments of the present invention, an output signal having a constant period is obtained. Therefore, when processing such as modulation or demodulation is performed using the output signal, distortion of the signal is not generated. Orthogonal modulation of the dividing output can be effectively performed, with the result that those circuits can be effectively used for a transceiver, a car telephone, a radio or the like.

A structure other than those of the first and second embodiments of the present invention can be used if a 1/2.5 dividing output having a constant period can be obtained by taking out outputs having different phases from the master and slave stages, respectively and combining those signals using logic circuits.

Heretofore, an example of the 1/2.5 frequency divider in which N is 5 has been described in the first and second embodiments of the present invention. Next, a ½ frequency divider in which N is 6 will be described as a third embodiment of the present invention in reference to FIG. 5.

Figure 5:
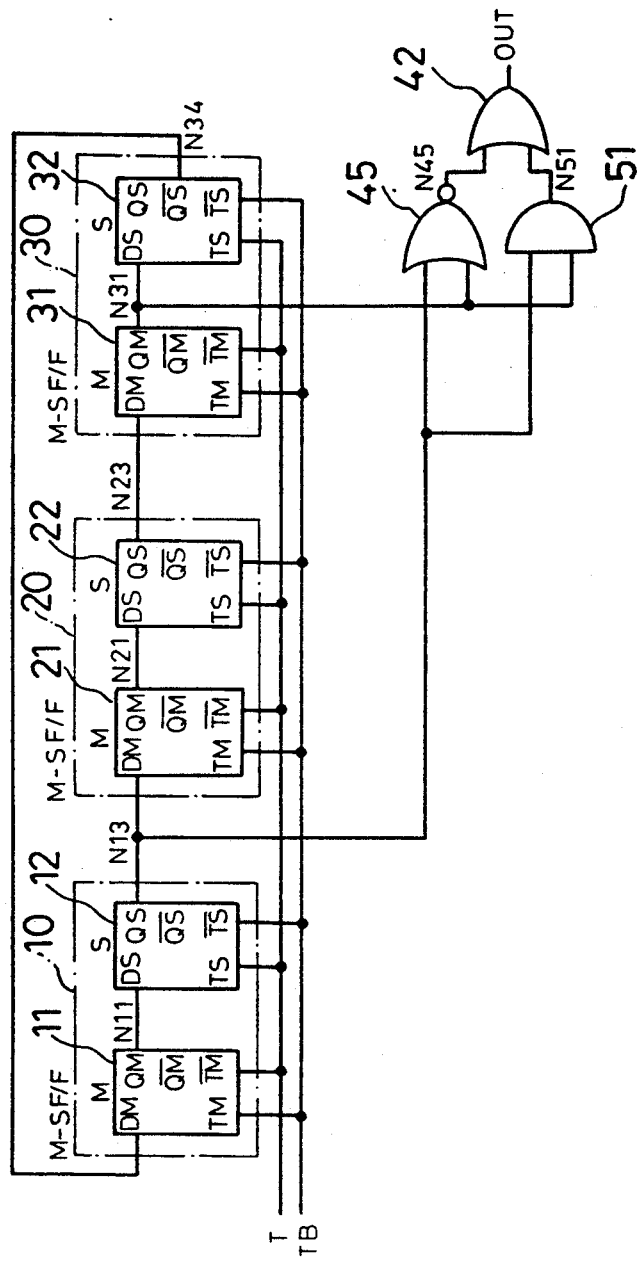
FIG. 5 is a view showing a structure of a frequency divider in accordance with a third embodiment of the present invention.

In FIG. 5, the same references as in FIG. 2 designate the same elements or elements having the same functions. In addition, reference numeral 45 designates a NOR circuit. Reference numerals N11 to N51 designate potentials of the corresponding signal lines. The output N13 of the slave stage 12 of the M-S F/F 10 and the output N31 of the master stage 31 of the M-S F/F 30 are input to the NOR circuit 45 and the AND circuit 51 and the outputs of the NOR circuit 45 and the AND circuit 51 are input to the OR circuit 42. The output of the OR circuit 42 is the output OUT of the frequency divider.

Figure 6:
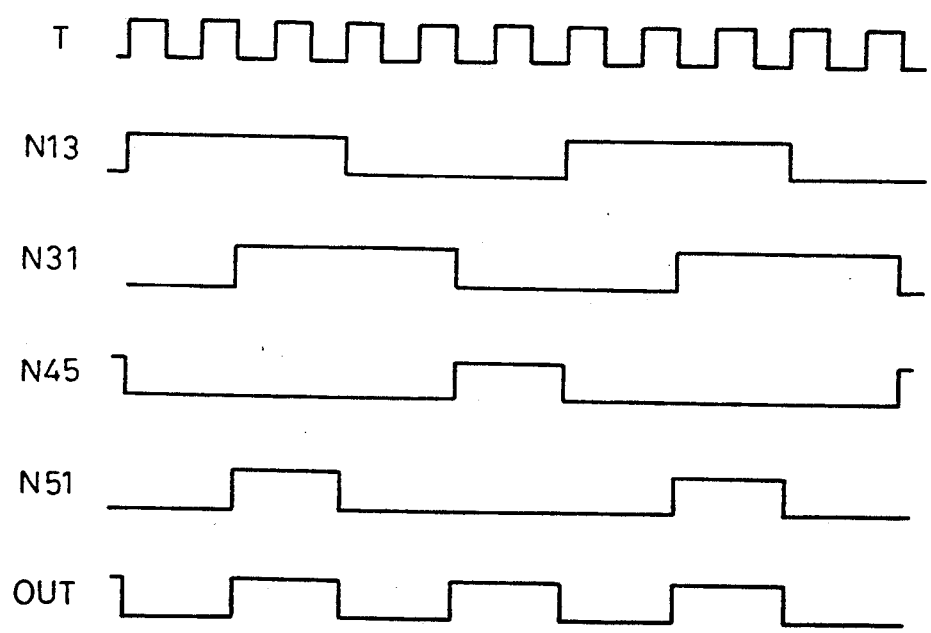
FIG. 6 is a view showing signal waveforms for describing operation of the frequency divider shown in FIG. 5.

Operation of this frequency divider will be described hereinafter in reference to FIG. 6. FIG. 6 shows signal waveforms on the corresponding signal lines in the frequency divider. In FIG. 6, each reference designates a waveform of a signal on a corresponding signal line shown in FIG. 5. The N45 is an output of NOR operation of the N13 and the N31 signals and one of its periods corresponds to 6 periods of the dividing input signal T. A signal lasing for 1.5 periods of the T is obtained while the N45 is at "High" level. The N51 is an output of AND operation of the N13 and the N31 signals and one of its periods corresponds to 6 periods of the dividing input signal T. A signal lasing for 1.5 periods of the T is obtained while the N41 is at "High" level. Although the "High" intervals of the N45 and the N51 are the same, their phase is different by a one-half period. In addition, since the output signal OUT of the frequency divider is an output of OR operation of the N45 and the N51, its period is three times as long as that of the dividing input signal T and the "High" interval thereof corresponds to 1.5 periods of the T.

More specifically, there is provided a frequency divider in which ⅓ dividing operation is performed and an output signal having a constant period and pulse width ½ of the period is obtained.

In addition, although the AND output and the NOR output of the N13 and the N31 are logically calculated at the OR circuit 42 in this embodiment of the present invention, the outputs of the N11 and the N23 or the outputs of the N21 and the N34 instead of the N13 and the N31 can be used. Alternatively, another structure can be used if there is provided a ⅓ dividing output having a constant period and a duty ratio of ½ by taking out the outputs having different phases from the master stage and the slave stage, respectively and then combining those signals using a logic circuit.

Next, a 1/3.5 frequency divider when N is 7 will be described as a fourth embodiment of the present invention in reference to FIG. 7.

Figure 7:
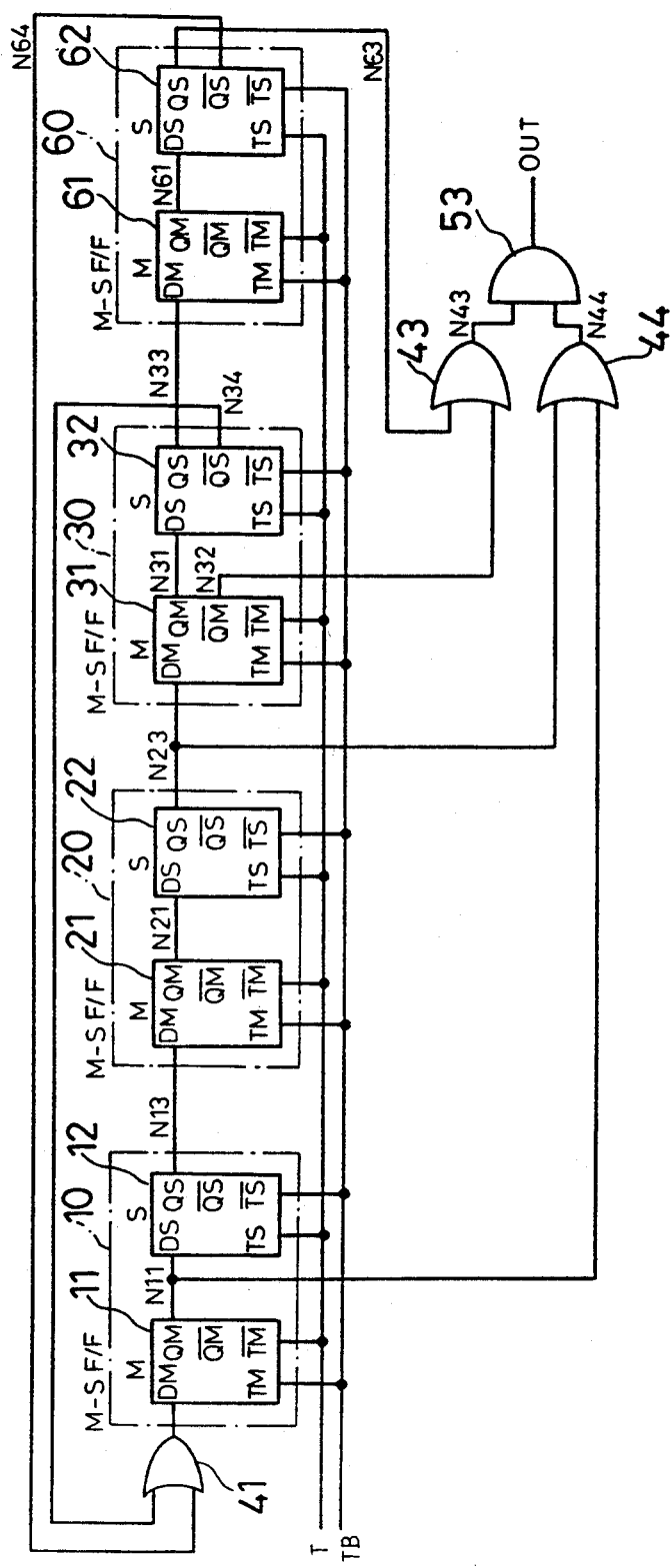
FIG. 7 is a view showing a structure of a frequency divider in accordance with a fourth embodiment of the present invention.

In FIG. 7, the same references as in FIG. 1 designate the same elements or elements having the same functions. In addition, reference numeral 60 designates an M-S F/F and reference numerals 61 and 62 designate the master stage and the slave stage of the M-S F/F 60, respectively. Reference numeral 53 designates an AND circuit and reference numerals 43 and 44 each designate an OR circuit. Reference numerals N11 to N64 each designate the potential on the corresponding signal line. The output N11 of the master stage 11 of the M-S F/F 10 and the output N23 of the slave stage 22 of the M-S F/F 20 are input to the OR circuit 44 and the output N32 of the master stage 31 of the M-S F/F 30 and the output N63 of the slave stage 62 of the M-S F/F 60 are input to the OR circuit 43. Then, the output N44 of the OR circuit 44 and the output N43 of the OR circuit 43 are input to the AND circuit 53 and then its output becomes the output OUT of the frequency divider.

Figure 8:
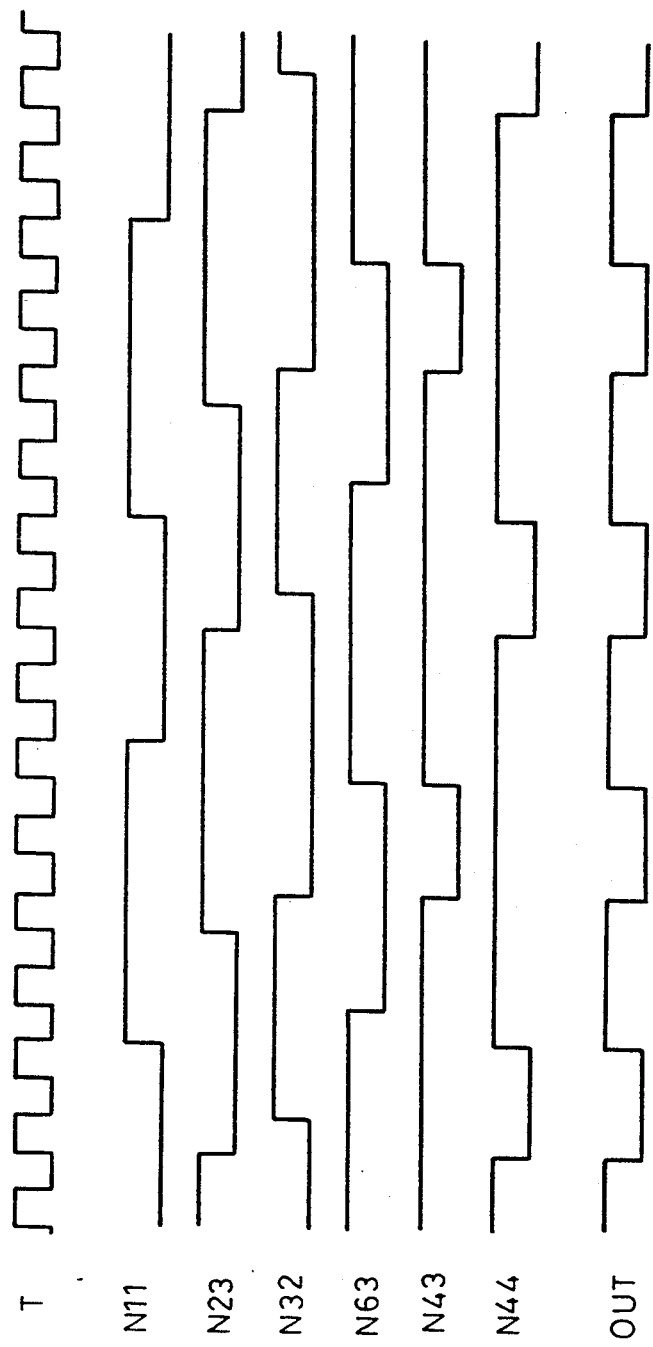
FIG. 8 is a view showing signal waveforms for describing operation of the frequency divider shown in FIG. 7.

Operation of this frequency divider will be described hereinafter in reference to FIG. 8. FIG. 8 shows signal waveforms on corresponding signal lines of the frequency divider. In FIG. 8, each reference designates a waveform of a signal on a corresponding signal line shown in FIG. 7. The N43 is an output of OR operation of the N32 and the N63 and one period of the N43 corresponds to 7 periods of the dividing input signal T. For 1.5 periods of the T, N43 is at "Low" level. The N44 is an output of OR operation of the N11 and the N23 and one period of the N44 corresponds to 7 periods of the dividing input signal T. For 1.5 periods of the T, N44 is at "Low" level. Although the period and the "High" intervals of "High" of the N43 are the same as those of the N44, their phases differ by one-half period. In addition, since the output signal OUT of the frequency divider is an output of the AND operation of the N43 and the N44, its period is 3.5 times as long as that of the dividing input signal T. More specifically, 1/3.5 dividing operation is performed.

According to the frequency divider in accordance with the fourth embodiment of the present invention, an output signal having a constant period can be obtained and processing such as modulation or demodulation of a signal can be performed by using this dividing output signal without generating any distortion of the signal.

In addition, another structure can be used in this embodiment of the present invention if the 1/3.5 dividing output having a constant period can be obtained by taking out outputs having different phases from the master stage and the slave stage respectively and combining those signals using the logic circuit In addition, although a description was given of a case where N=5, 6 and 7 in the 1/(N/2) frequency divider in the first to fourth embodiments of the present invention, a frequency divider can be implemented by the same method even if the N is another value.

As described above, according to the first to fourth embodiments of the present invention, an output signal whose period does not vary with time can be obtained and also when the N is an even number, an output signal whose pulse width is ½ of the period can be further obtained.

There will be shown a method for forming an output signal whose duty ratio is ½ from the output signals of the frequency divider of 1/(N/2) as a fifth embodiment of the present invention.

As its embodiment, a 1/(5/2), that is, 1/2.5 frequency divider will be described hereinafter.

Figure 11:
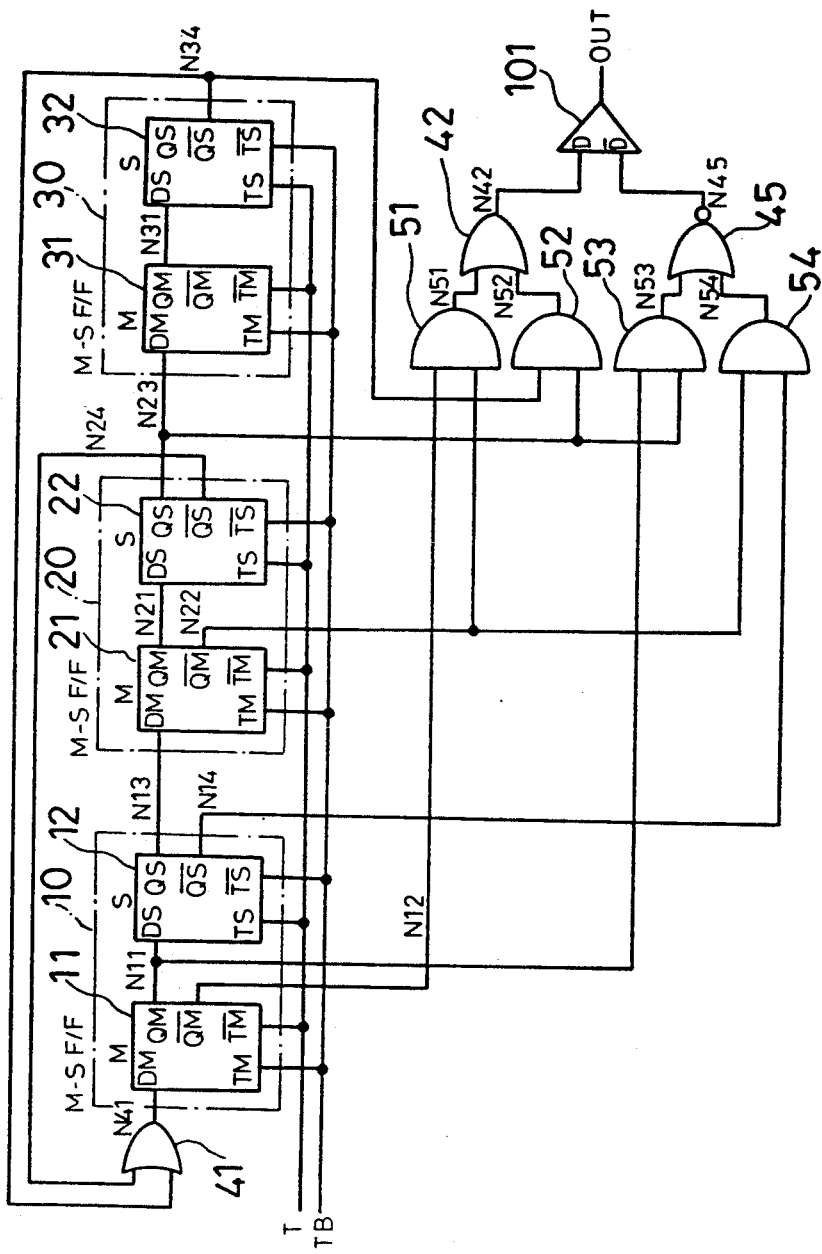
FIG. 11 is a view showing a structure of a frequency divider in accordance with a fifth embodiment of the present invention.

FIG. 11 is a view showing a circuit in which the duty ratio of the output signal of the frequency divider shown in FIG. 1 of the first embodiment of the present invention is made to be ½. In FIG. 11, the same references as in FIG. 1 designate the same elements or elements having the same functions. In addition, reference numerals 53 and 54 each designate an AND circuit, reference numeral 45 designates a NOR circuit and reference numeral 101 designates a differential amplifier. Reference numeral N42 designates an output signal of the OR circuit 42 and reference numerals N53 and N54 designate output signals of the AND circuits 53 and 54, respectively.

Figure 12A:
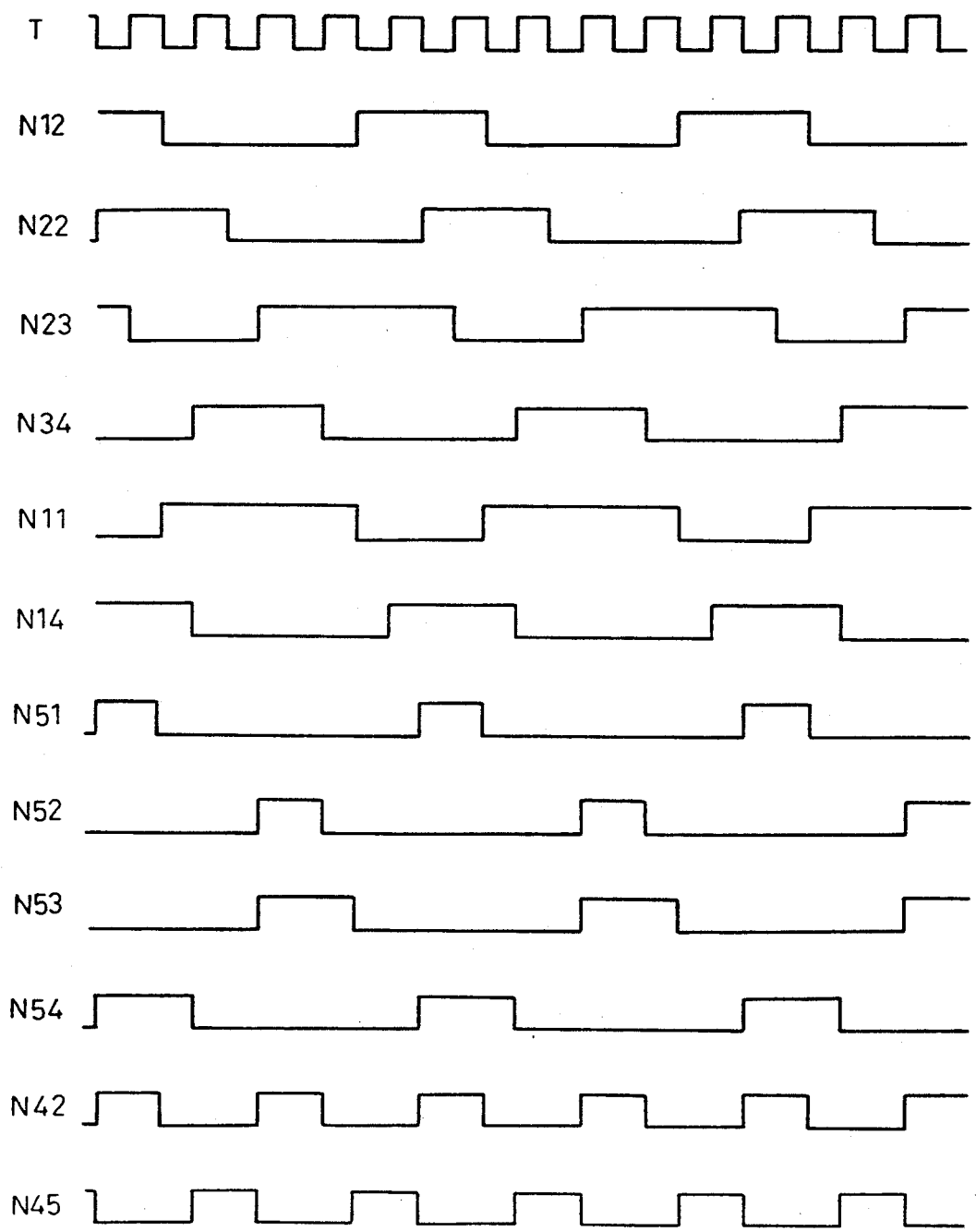
FIGS. 12(a) and 12(b) are views showing signal waveforms for describing operation of the frequency divider shown in FIG. 11.
Figure 12B:
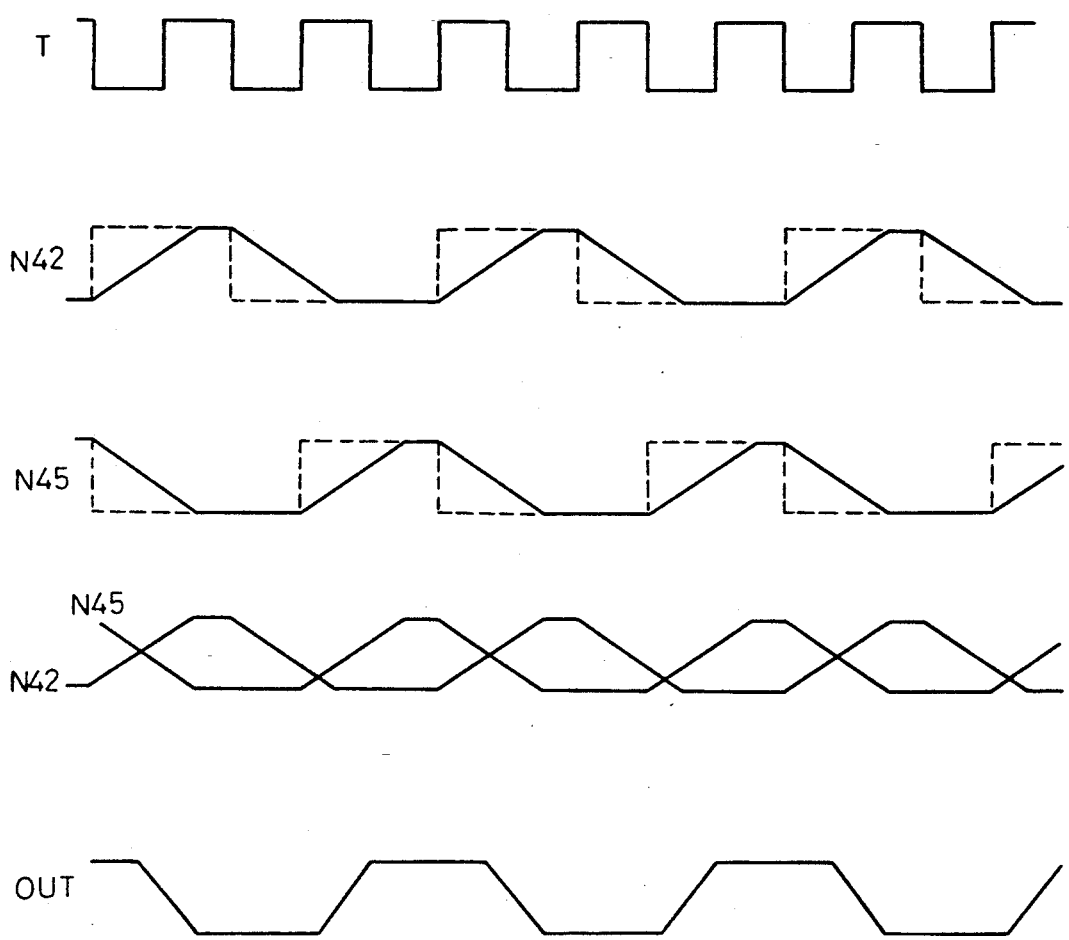
Figure 13:
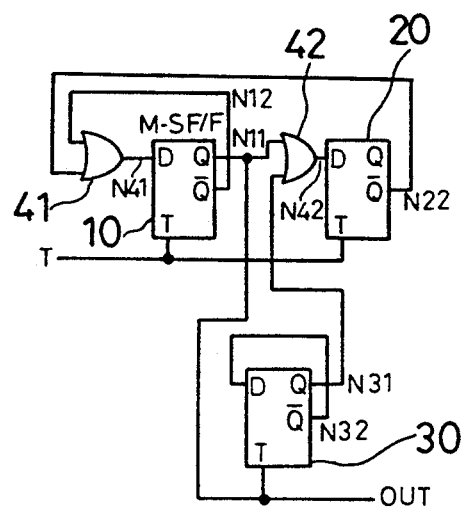
FIG. 13 is a view showing a structure of a conventional frequency divider.
Figure 14:
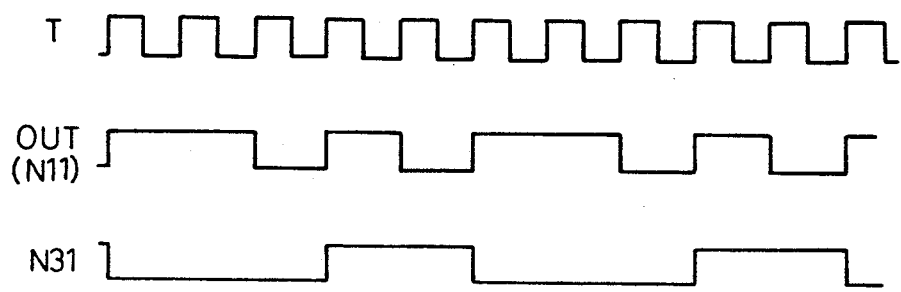
FIG. 14 is a view showing signal waveforms for describing operation of the frequency divider shown in FIG. 13.
Figure 15:
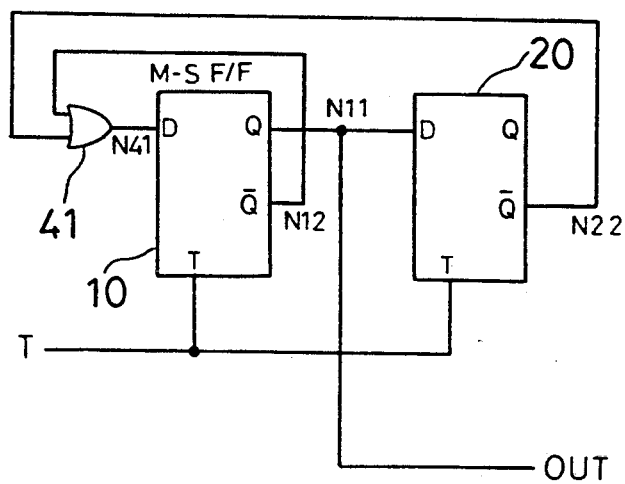
FIG. 15 is a view showing a structure of another conventional frequency divider.
Figure 16:
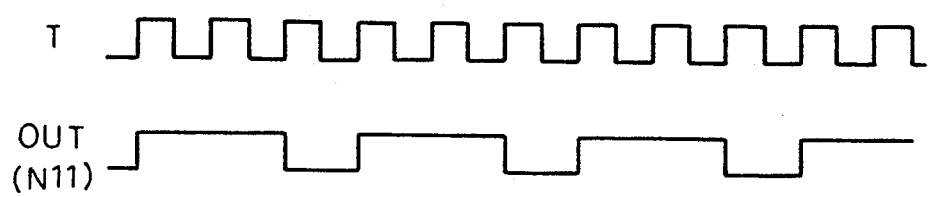
FIG. 16 is a view showing signal waveforms for describing operation of the frequency divider shown in FIG. 15.

Next, operation thereof will be described hereinafter in reference to FIGS. 12(a) and 12(b) showing signal waveforms of the signal lines of the frequency divider.

In FIGS. 12(a) and 12(b), each reference designates a waveform of a signal on a corresponding signal line shown in FIG. 11. The N42 corresponds to the output of the frequency divider shown in FIG. 1 and one of its periods corresponds to 2.5 periods of the dividing input signal T and the "High" interval of N42 corresponds to one period of the T. One period of the N45 corresponds to 2.5 periods of the dividing input signal T and the "High" interval of N45 corresponds to one period of the T. When an input pulse signal is a high frequency of 1 GHz band or more, the signal rise and fall times increase because of the influence of a wiring in the circuit as shown in FIG. 12(b). When these two signals N42 and N45 are input to the differential amplifier 101, the differential amplifier 101 compares one signal with the other. As a result, a signal having a pulse width which is ½ of a period (duty ratio 1/2) is obtained as the output signal OUT as shown in FIG. 12(b). As described above, the frequency divider performs 1/2.5 dividing and at the same time outputs the signal whose pulse width is ½ of the period.

According to the structure of this embodiment of the present invention, when the N is an odd number in accordance with the first, second and fourth embodiments of the present invention, an output signal whose duty ratio is ½ can be also obtained.

In addition, although a description was given of a case where the 1/2.5 frequency divider is used and the duty ratio of its output signal is ½ in the fifth embodiment of the present invention, the frequency divider is not limited to the 1/2.5 frequency divider and another one can be used if it is the 1/(N/2) frequency divider. However, when the N is an even number, for example as described in the third embodiment of the present invention, the output of the divider already has a duty ratio of ½, so that pulse signal forming means in accordance with the fifth embodiment of the present invention is not necessary.

In addition, according to the fifth embodiment of the present invention, although an example in which the duty ratio of the dividing output of the 1/(N/2) frequency divider is ½ was shown, a method for forming a signal having the duty ratio of ½ from any pulse signal whose duty ratio is not ½ will be described hereinafter.

Figure 9:
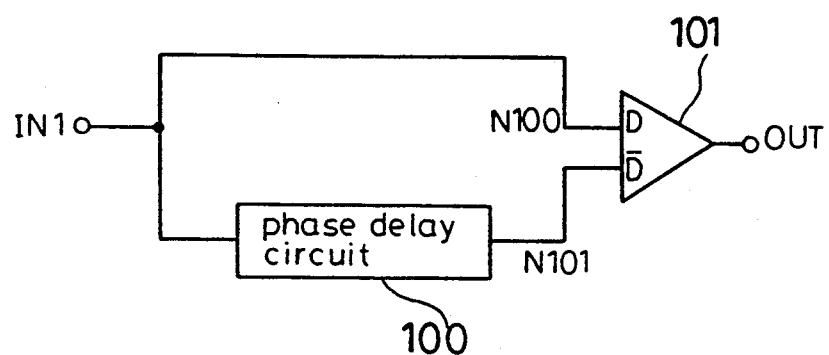
FIG. 9 is a view showing a structure of a pulse signal former in accordance with a sixth embodiment of the present invention.

FIG. 9 shows a pulse signal former in accordance with a sixth embodiment of the present invention. In FIG. 9, reference numeral 100 designates a phase delay circuit, reference numeral 101 designates a differential amplifier, reference numeral IN1 designates an input signal terminal, reference numeral OUT designates an output signal terminal, references D and $\overline{D}$ designate a signal input terminal and an inverted signal input terminal of the differential amplifier 101, respectively, and reference numerals N100 and N101 each designate a differential amplifier input signal.

Next, operation thereof will be described hereinafter.

The input pulse signal IN1 whose duty ratio is not ½ is divided into two and one is input to the differential amplifier 101 as it is and the other is input to the phase delay circuit. The phase of the signal input to the phase delay circuit is delayed by one pulse width by the phase delay circuit and then the signal is input to the differential amplifier 101.

Figure 10:
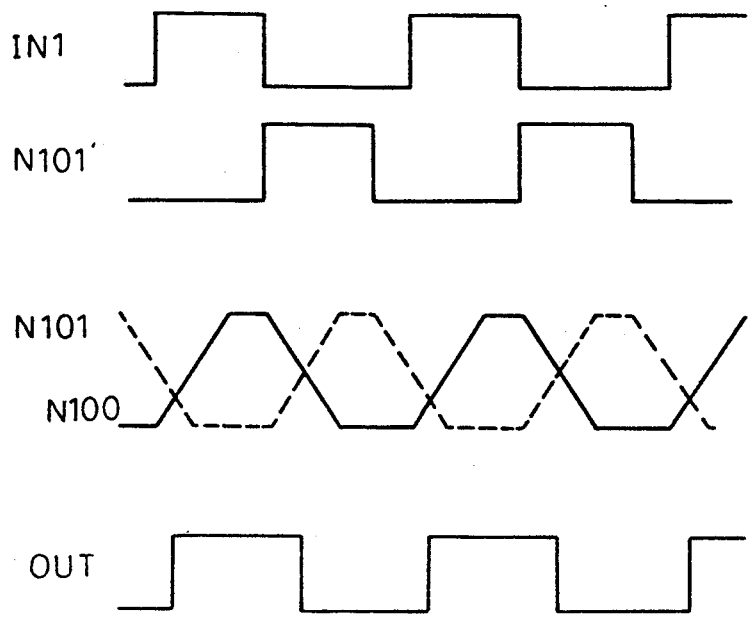
FIG. 10 is a view showing signal waveforms for describing operation of the pulse signal former shown in FIG. 9.

Operation thereof will be described hereinafter in reference to FIG. 10. In FIG. 10, reference numeral IN1 designates an input signal and reference numerals N100 and N101 designate input signals of the differential amplifier. In addition, a dotted line designates the N101 signal and N100 designates the signal obtained by delaying the input signal IN1 by the pulse width and reference numeral OUT designate an output signal. Similar to the fifth embodiment of the present invention, when the input pulse signal IN1 is a high frequency of 1 GHz or more, signal rise and fall times increase because of the influence of the wiring in the circuit as shown by the N100 in FIG. 10. This increase is also observed in the signal N101. When these two signals are input to the differential amplifier 101, one signal is compared with the other in the differential amplifier 101, with the result that a signal whose pulse width is ½ of the period (duty ratio ½) is obtained as the output signal OUT shown in FIG. 10.

Figure 17:
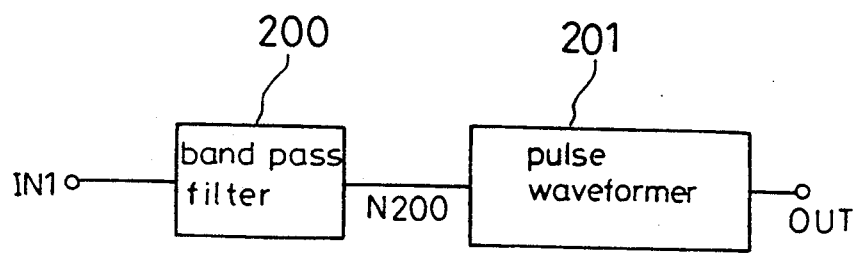
FIG. 17 is a view showing a conventional pulse signal former.

Therefore, according to the sixth embodiment of the present invention, a signal whose duty ratio is ½ can be obtained with a simple circuit structure and its usable frequency range can be increased unlike the conventional example in which the pulse signal former shown in FIG. 17 is used.

In addition, according to the sixth embodiment of the present invention, the phase delay circuit is used when signals whose periods and pulse widths are the same but phases are different by a pulse width are formed. However, another method can be used if the same signal can be obtained.

According to the frequency divider in accordance with the present invention, the 1/N frequency divider is formed using a master-slave type flip-flop (M-S F/F) and two or more output signals whose periods are the sam but phases are different are taken out from the 1/N frequency divider. Then, these signals are logically combined to obtain the 1/(N/2) dividing signal. Therefore, an output whose period does not vary with time can be obtained as the output of the frequency divider and an output whose pulse width is ½ of the period can be further obtained when the N is an even number. As a result, modulation or demodulation can be performed with high precision by using the output signal without generating distortion in a signal.

In addition, according to the present invention, a differential amplifier is provided in the 1/(N/2) frequency divider having the above structure and then two signals whose periods and pulse widths are the same but phases are different by one pulse width are taken out from the 1/(N/2) frequency divider and then these signals are combined by the differential amplifier. As a result, a dividing signal output whose pulse width is ½ of its period can be obtained.

In addition, according to the pulse signal former of the present invention, two signals whose periods and pulse widths are the same but phases are different by a pulse width are input to the differential amplifier and then the output obtained by comparing one signal with the other is provided as an output signal. As a result, a signal whose pulse width is ½ of its period can be taken out from the signal whose pulse width is not ½.

Although the present invention has been described and illustrated in detail, it is clearly understood that the same is by way of illustration and example only and is not to be taken by way of limitation, the spirit and scope of the present invention being limited only by the term of the appended claims.

What is claimed is:

1. A frequency divider comprising at least three stages of master-slave flip-flops, each stage including a master flip-flop and a slave flip-flop, the stages being connected to each other in series to construct a 1/N frequency divider producing an output signal at each master flip-flop and at each slave flip-flop of each stage, the output signals of each stage having the same period but different phases, and means for combining pairs of the output signals from respective stages including at least one output signal from one master flip-flop of one stage and one output signal from one slave flip-flop of a different stage to obtain a 1/(N/2) divided output signal where N is an integer.

2. A frequency divider comprising:
at least three master-slave flip-flops in at least first, second, and third stages, each stage including a master flip-flop and a slave flip-flop to construct a 1/5 frequency divider;
a first AND circuit to which inverted outputs from the master flip-flops of the first and second stages are input;
a second AND circuit to which an output from the slave flip-flop of the second stage and an inverted output from the slave flip-flop of the third stage are input; and
an OR circuit to which outputs of said first and second AND circuits are input and from which a 1/2.5 divided output is obtained.

3. A frequency divider comprising:
at least three master-slave flip-flops in at least first, second, and third stages, each stage including a master flip-flop and a slave flip-flop to construct a 1/5 frequency divider;
a first AND circuit to which outputs from the slave flip-flops of the first and third stages are input;
a second AND circuit to which an output from the master flip-flop of the first stage and an inverted output from the master flip-flop of the second stage are input; and
an OR circuit to which outputs of said first and second AND circuits are input and from which a 1/2.5 divided output is obtained.

4. A frequency divider comprising:
at least three master-slave flip-flops in at least first, second, and third stages, each stage including a master flip-flop and a slave flip-flop to construct a 1/6 frequency divider;
a NOR circuit to which an output from the slave flip-flop of the first stage and from the master flip-flop of the third stage are input;
an AND circuit to which an output from the slave flip-flop of the first stage and an output from the master flip-flop of the third stage are input; and
an OR circuit to which outputs from said NOR circuit and said AND circuit are input and from which a ⅓ divided output is obtained.

5. A frequency divider comprising:
four master-slave flip-flops connected to each other in first, second, third, and fourth stages, each stage including a master and a slave flip-flop to construct a 1/7 frequency divider;
a first OR circuit to which outputs from the master flip-flop of the first stage and from the slave flip-flop of the second stage are input;
a second OR circuit to which an inverted output from the master flip-flop of the third stage and an output from the slave flip-flop of the fourth stage are input; and
an AND circuit to which outputs of said first and second OR circuits are input and from which a 1/3.5 divided output is obtained.

6. A frequency divider in accordance with claim 1 comprising a differential amplifier having two input terminals and one output terminal, two 1/(N/2) dividing output signals that are output from the frequency divider and that have the same periods and pulse widths but phases shifted by a pulse width being input to the respective input terminals of the differential amplifier, the differential amplifier responding to the dividing output signals by producing at the output terminal a 1/(N/2) divided output signal having a duty ratio of ½.

7. A frequency divider comprising:
three master-slave flip-flops in at least first, second, and third stages, each stage including a master flip-flop and a slave flip-flop to construct a 1/5 frequency divider;
a first AND circuit to which inverted outputs from the master flip-flops of the first and second stages are input;

a second AND circuit to which an output from the slave flip-flop of the second stage and an inverted output from the slave flip-flop of the third stage are input;

a third AND circuit to which an output from the master flip-flop of the first stage and an output from the slave flip-flop of the second stage are input;

a fourth AND circuit to which an inverted output from the slave flip-flop of the first stage and an inverted output from the master flip-flop of the second stage are input;

an OR circuit to which outputs of said first and second AND circuits are input;

a NOR circuit to which outputs from said third and fourth AND circuits are input; and a differential amplifier to which outputs of said OR circuit and said NOR circuit are input and from which a 1/2.5 divided output whose pulse width is ½ of its period is obtained.

* * * * *